(12) United States Patent
Zhang

(10) Patent No.: US 10,942,580 B2
(45) Date of Patent: Mar. 9, 2021

(54) INPUT CIRCUITRY, TERMINAL, AND TOUCH RESPONSE METHOD AND DEVICE

(71) Applicant: Beijing Xiaomi Mobile Software Co., Ltd., Beijing (CN)

(72) Inventor: Xu Zhang, Beijing (CN)

(73) Assignee: Beijing Xiaomi Mobile Software Co., Ltd., Beijing (CN)

( * ) Notice: Subject to any disclaimer, the term of this patent is extended or adjusted under 35 U.S.C. 154(b) by 0 days.

(21) Appl. No.: 15/402,787

(22) Filed: Jan. 10, 2017

(65) Prior Publication Data
US 2017/0293387 A1 Oct. 12, 2017

(30) Foreign Application Priority Data

Apr. 11, 2016 (CN) .......................... 2016 1 0222252

(51) Int. Cl.
| | | |
|---|---|---|
| *G06F 3/02* | (2006.01) | |
| *G06F 3/041* | (2006.01) | |
| *G06F 3/0338* | (2013.01) | |
| *G06F 3/01* | (2006.01) | |
| *G06F 3/044* | (2006.01) | |
| *G06K 9/00* | (2006.01) | |
| *G06F 3/0482* | (2013.01) | |

(52) U.S. Cl.
CPC ............ *G06F 3/0202* (2013.01); *G06F 3/016* (2013.01); *G06F 3/0338* (2013.01); *G06F 3/041* (2013.01); *G06F 3/044* (2013.01); *G06K 9/0002* (2013.01); *G06F 3/0482* (2013.01); *G06F 2203/04105* (2013.01); *G06K 9/00087* (2013.01); *H03K 2217/9651* (2013.01); *H03K 2217/96062* (2013.01)

(58) Field of Classification Search
CPC ...... G06F 3/0416; G06F 3/0414; G06F 3/016; G06F 3/044; G06F 3/0482; G06F 3/041

USPC .......................................................... 345/174
See application file for complete search history.

(56) References Cited

U.S. PATENT DOCUMENTS

| | | |
|---|---|---|
| 2008/0202824 A1 | 8/2008 | Philipp et al. |
| 2010/0027854 A1 | 2/2010 | Chatterjee et al. |
| | (Continued) | |

FOREIGN PATENT DOCUMENTS

| | | |
|---|---|---|
| CN | 103577811 A | 2/2014 |
| CN | 103686274 A | 3/2014 |
| | (Continued) | |

OTHER PUBLICATIONS

International Search Report issued in corresponding International Application No. PCT/CN2016/095991, dated Jan. 18, 2017, 5 pages.
Written Opinion of the International Search Authority issued in corresponding International Application No. PCT/CN2016/095991, dated Jan. 18, 2017, 4 pages.
The iPhone5S Home key supports fingerprint identification abstract, Sep. 11, 2013, 3 pages.

(Continued)

*Primary Examiner* — Fred Tzeng
(74) *Attorney, Agent, or Firm* — Arch & Lake LLP

(57) ABSTRACT

An input circuitry includes: a touch key layer and a pressure sensing layer. The touch key layer is positioned above the pressure sensing layer; the touch key layer is configured to receive touch operation. The pressure sensing layer is configured to acquire touch pressure of the touch operation performed on the touch key layer. The touch pressure is acquired through the pressure sensing layer, a response instruction is generated according to the touch pressure, and the terminal executes the touch instruction.

19 Claims, 7 Drawing Sheets

(56) References Cited

U.S. PATENT DOCUMENTS

| | | |
|---|---|---|
| 2012/0092263 A1 | 4/2012 | Peterson et al. |
| 2012/0105081 A1 | 5/2012 | Shaikh et al. |
| 2013/0018489 A1 | 1/2013 | Grunthaner et al. |
| 2013/0307818 A1 | 11/2013 | Pope et al. |
| 2013/0332892 A1* | 12/2013 | Matsuki ............... G06F 3/0488 715/863 |
| 2014/0008203 A1 | 1/2014 | Nathan et al. |
| 2014/0047706 A1 | 2/2014 | Shaikh et al. |
| 2014/0096622 A1* | 4/2014 | Kawate .................. G01L 5/00 73/862.621 |
| 2014/0216914 A1 | 8/2014 | Pope et al. |
| 2015/0071511 A1 | 3/2015 | Wang |
| 2015/0242675 A1 | 8/2015 | Pope et al. |
| 2015/0323992 A1 | 11/2015 | Einaudi |
| 2016/0004896 A1 | 1/2016 | Pope et al. |
| 2016/0062530 A1 | 3/2016 | Huppi et al. |
| 2016/0070404 A1 | 3/2016 | Kerr et al. |
| 2016/0196466 A1 | 7/2016 | Jiang et al. |
| 2016/0267313 A1 | 9/2016 | Pope et al. |
| 2017/0003795 A1* | 1/2017 | Lee ....................... G06F 3/0346 |
| 2017/0109565 A1 | 4/2017 | Pope et al. |

FOREIGN PATENT DOCUMENTS

| | | |
|---|---|---|
| CN | 104537366 A | 4/2015 |
| CN | 204331746 U | 5/2015 |
| CN | 104679401 A | 6/2015 |
| CN | 105138171 A | 12/2015 |
| CN | 105302373 A | 2/2016 |
| CN | 205121522 U | 3/2016 |
| EP | 2410408 A1 | 1/2012 |

OTHER PUBLICATIONS

Partial Supplementary European Search Report in EP Application No. 6202426.9, dated Jul. 4, 2017, 15 pages.

Supplementary European Search Report in EP Application No. 16202426.9, dated Oct. 17, 2017, 12 pages.

International Search Report in international application No. PCT/CN2016/095991, dated Jan. 18, 2017, 5 pages.

Written Opinion of the International Search Authority in international application No. PCT/CN2016/095991, dated Jan. 18, 2017, 4 pages.

* cited by examiner

| it is detected whether a terminal is in a predetermined mode, the predetermined mode being at least one of a screen locking mode, a payment mode and an identity authentication mode | 901 |

↓

| if the terminal is in the predetermined mode, a fingerprint identification layer is controlled to acquire and identify a fingerprint image | 902 |

INPUT CIRCUITRY, TERMINAL, AND TOUCH RESPONSE METHOD AND DEVICE

CROSS-REFERENCE TO RELATED APPLICATION

This application is filed based upon and claims priority to Chinese Patent Application No. 201610222252.8, filed on Apr. 11, 2016, the entire contents of which are incorporated herein by reference.

TECHNICAL FIELD

The present disclosure generally relates to the technical field of touch control, and more particularly, to an input circuitry, a terminal, and a touch response method and device.

BACKGROUND

At present, most mobile terminals have three touch physical keys: a task management key, a home key, and a back key.

In related arts, a mobile terminal is controlled by responses of the mobile terminal to operations performed on three touch physical keys. For example, when a user is intended to return to a previous interface from a current interface, the back key is touched to achieve the purpose of returning to the previous interface from the current interface.

SUMMARY

According to a first aspect of the present disclosure, there is provided an input circuitry. The input circuitry may include: a touch key layer and a pressure sensing layer; the touch key layer may be positioned above the pressure sensing layer; the touch key layer may be configured to receive a touch operation; and the pressure sensing layer may be configured to acquire touch pressure of the touch operation performed on the touch key layer.

According to a second aspect of the present disclosure, there is provided a terminal. The terminal may include a touch control chip and at least one input circuitry; the touch control chip may be connected with the input circuitry; and at least one input circuitry is the input circuitry provided according to the first aspect.

According to a third aspect of the present disclosure, there is provided a touch response method, which may be implemented by a terminal including the input circuitry provided according to the first aspect, the method including that: when the touch key layer senses a touch operation performed on the input circuitry, touch pressure is acquired through the pressure sensing layer; a response instruction is generated according to the touch pressure; and the response instruction is executed.

According to a fourth aspect of the present disclosure, there is provided a touch response device for use in a terminal comprising the input circuitry according to the first aspect, which may include: a processor; and a memory configured to store instructions executable by the processor, wherein the processor may be configured to: when the touch key layer senses touch operation performed on the input circuitry, acquire touch pressure through the pressure sensing layer; generate a response instruction according to the touch pressure; and execute the response instruction.

According to a fifth aspect of the disclosure, there is provided a non-transitory computer-readable storage medium having stored therein instructions that, when executed by a processor, causes the processor to perform acts, which may be implemented by a terminal including the input circuitry provided according to the first aspect. The acts may include: when the touch key layer senses a touch operation performed on the input circuitry, touch pressure is acquired through the pressure sensing layer; a response instruction is generated according to the touch pressure; and the response instruction is executed.

It is to be understood that the above general descriptions and detailed descriptions below are only exemplary and explanatory and not intended to limit the present disclosure.

BRIEF DESCRIPTION OF THE DRAWINGS

The accompanying drawings, which are incorporated in and constitute a part of this specification, illustrate embodiments consistent with the present disclosure and, together with the specification, serve to explain the principles of the present disclosure.

DETAILED DESCRIPTION

The terminology used in the present disclosure is for the purpose of describing exemplary embodiments only and is not intended to limit the present disclosure. As used in the present disclosure and the appended claims, the singular forms "a," "an" and "the" are intended to include the plural forms as well, unless the context clearly indicates otherwise. It shall also be understood that the terms "or" and "and/or" used herein are intended to signify and include any or all possible combinations of one or more of the associated listed items, unless the context clearly indicates otherwise.

It shall be understood that, although the terms "first," "second," "third," etc. may be used herein to describe various information, the information should not be limited by these terms. These terms are only used to distinguish one category of information from another. For example, without departing from the scope of the present disclosure, first information may be termed as second information; and similarly, second information may also be termed as first information. As used herein, the term "if" may be understood to mean "when" or "upon" or "in response to" depending on the context.

Reference throughout this specification to "one embodiment," "an embodiment," "exemplary embodiment," or the like in the singular or plural means that one or more particular features, structures, or characteristics described in connection with an embodiment is included in at least one embodiment of the present disclosure. Thus, the appearances of the phrases "in one embodiment" or "in an embodiment," "in an exemplary embodiment," or the like in the singular or plural in various places throughout this specification are not necessarily all referring to the same embodiment. Furthermore, the particular features, structures, or characteristics in one or more embodiments may be combined in any suitable manner.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the present disclosure. Instead, they are merely examples of devices and methods consistent with some aspects related to the present disclosure as recited in the appended claims.

Figure 1:
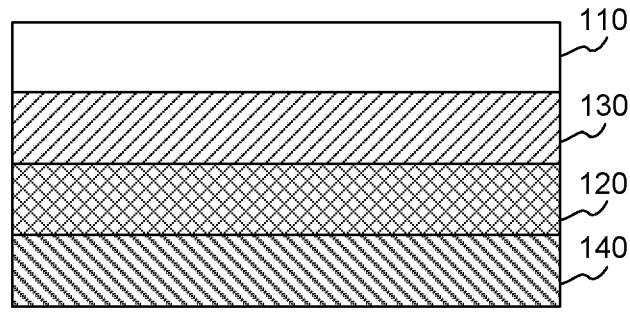
FIG. 1 is a structure diagram of an input circuitry according to one or more exemplary embodiments.

FIG. 1 is a structure diagram of an input circuitry according to one or more exemplary embodiments of the present disclosure. The input circuitry includes: a touch key layer 110 and a pressure sensing layer 120. For example, the input circuitry may be a physical key component including a plurality of layers.

The touch key layer 110 is positioned above the pressure sensing layer 120. For example, the touch key layer 110 may be a capacitive touch key layer, and has certain elasticity, the touch key layer 110 may be deformed when there is force acting on the touch key layer 110, and the touch key layer 110 is recovered into an original state when the force acting on the touch key layer 110 disappears.

Figure 2:
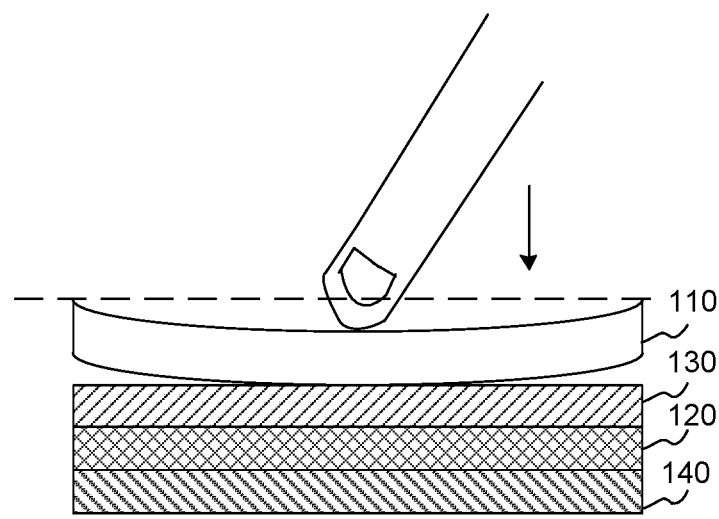
FIG. 2 is a structure diagram of an input circuitry according to one or more exemplary embodiments.

As shown in FIG. 2, when a user presses the touch key layer 110, the touch key layer is sunken downwards and deviated from an original position by a certain distance; and when the user releases a hand, the input circuitry is recovered into the original state, as shown in FIG. 1.

The touch key layer 110 is configured to receive touch operation performed on the touch key layer 110. The pressure sensing layer 120 is configured to acquire touch pressure of the touch operation performed on the touch key layer 110.

Alternatively or additionally, the input circuitry may further include a fingerprint identification layer 130. For example, the fingerprint identification layer 130 is positioned between the touch key layer 110 and the pressure sensing layer 120. The fingerprint identification layer 130 is configured to acquire and identify a fingerprint image.

Alternatively or additionally, the input circuitry further includes a vibration layer 140. The vibration layer 140 is positioned below the pressure sensing layer 120. The vibration layer 140 generates vibration of which a vibration amplitude is directly proportional to the touch pressure when the pressure sensing layer 120 acquires the touch pressure.

Figure 3:
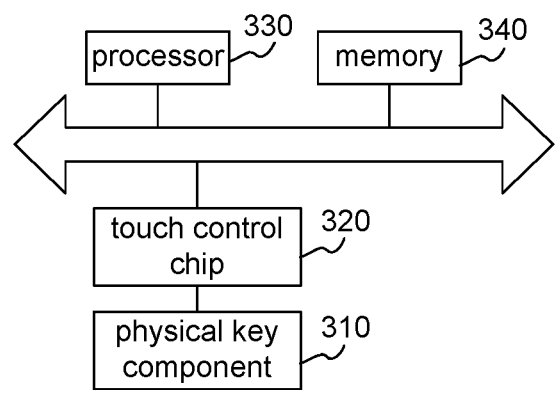
FIG. 3 is a hardware structure diagram of a terminal according to one or more exemplary embodiments.

FIG. 3 is a hardware structure diagram of a terminal according to one or more embodiments of the present disclosure. The terminal may be electronic equipment such as a smart phone, a tablet computer, an electronic reader and a notebook computer. The terminal includes at least one input circuitry 310 shown in FIG. 1, a touch control chip 320, a processor 330 and a memory 340. Here, the input circuitry 310 is connected with the touch control chip 320, the touch control chip 320 is connected with the processor 330, and the processor 330 is connected with the memory 340.

An instruction executable for the processor 330 is stored in the memory 340. Alternatively or additionally, a predetermined fingerprint image is stored in the memory 340.

Figure 4:
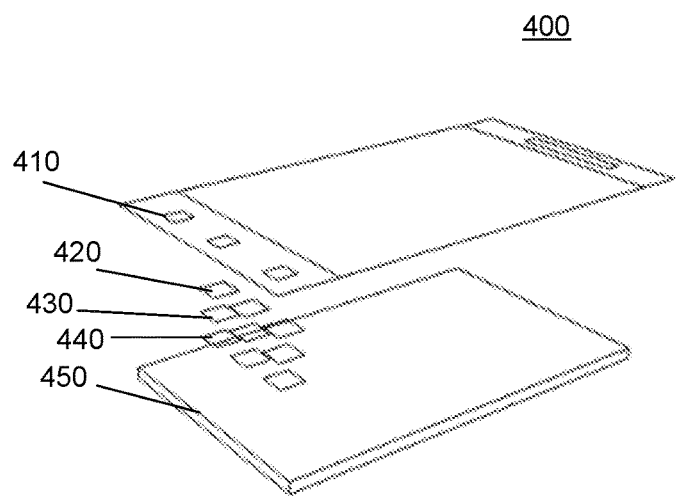
FIG. 4 is a structure diagram of a terminal according to one or more exemplary embodiments.

Alternatively or additionally, an input circuitry 310 may correspond to a touch key area on the terminal. FIG. 4 is a structure diagram of a terminal 400 including an input circuitry shown in FIG. 1.

As shown in FIG. 4, the terminal 400 includes three input components, wherein touch key layers 410 of the three input components are connected to be strip-like, the touch key layers 410 correspond to three touch key areas, and a fingerprint identification layer 420, a pressure sensing layer 430 and a vibration layer 440 are correspondingly arranged below each key area.

Alternatively or additionally, only the pressure sensing layer 430 may be arranged, or, only the pressure sensing layer 430 and the vibration layer 440 are arranged, below each key area of the touch key layer 410, which is not shown in FIG. 4.

Alternatively or additionally, below the three key areas, the fingerprint identification layers 420 may be connected to be strip-like, or, the pressure sensing layers 430 may be connected to be strip-like, or, the vibration layers 440 may be connected to be strip-like.

Figure 5:
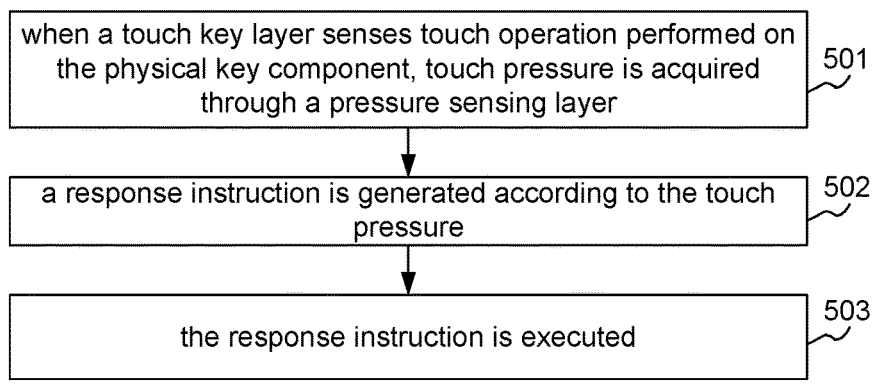
FIG. 5 is a flow chart of a touch response method according to one or more exemplary embodiments.

FIG. 5 is a flow chart of a touch response method according to an exemplary embodiment of the present disclosure. The touch response method may be implemented by a terminal including an input circuitry shown in FIG. 1. The touch response method may include the following steps:

Step 501: when a touch key layer senses touch operation performed on the input circuitry, touch pressure is acquired through a pressure sensing layer;

Step 502: a response instruction is generated according to the touch pressure; and Step 503: the response instruction is executed.

From the above, according to the touch response method provided by the present disclosure, when the touch key layer senses the touch operation performed on the input circuitry, the touch pressure is acquired through the pressure sensing layer, the response instruction is generated according to the touch pressure, and the terminal executes the response instruction. Since the response instruction is generated according to the touch pressure of the touch operation, the problem that user's false touch operations are responded by a terminal may be avoided, and it is possible to achieve the effects of effectively distinguishing intended operation and the false touch operation of the user and improving user experiences.

Figure 6:
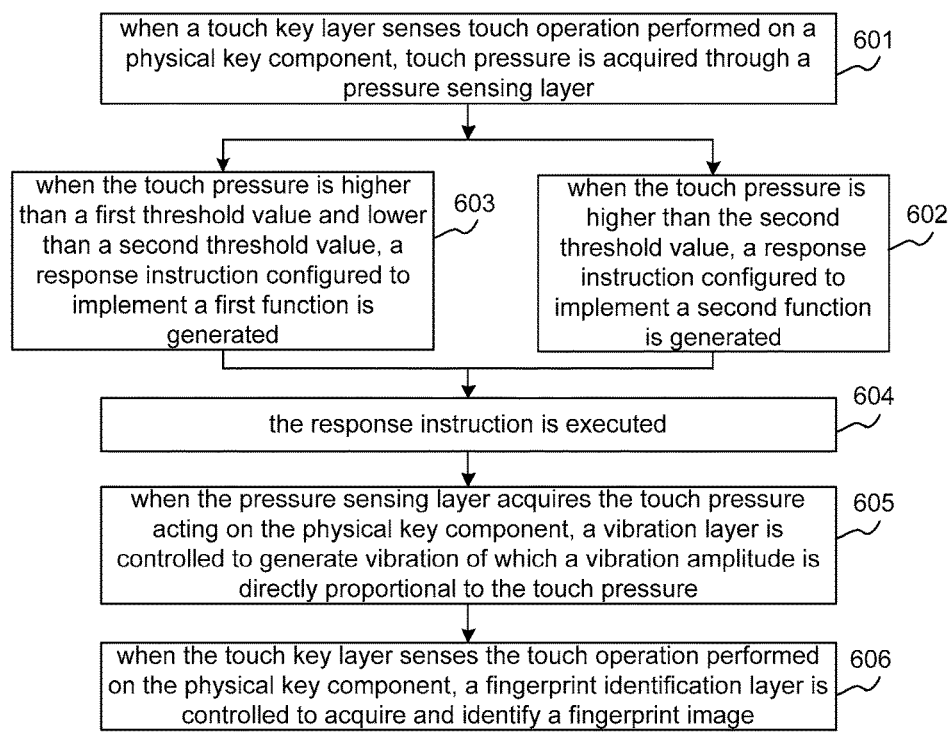
FIG. 6 is a flow chart of a touch response method according to one or more exemplary embodiments.

FIG. 6 is a flow chart of a touch response method according to an exemplary embodiment of the present disclosure. The touch response method may be implemented by a terminal including an input circuitry shown in FIG. 1, the input circuitry includes a touch key layer, a pressure sensing layer, a vibration layer and a fingerprint identification layer, and the touch response method may include the following steps.

Step 601: when the touch key layer senses touch operation performed on the input circuitry, touch pressure is acquired through the pressure sensing layer.

A magnitude of the touch pressure is detected, the touch pressure is compared with a first threshold value and a second threshold value, Step 602 is executed when the touch pressure is higher than the first threshold value and lower than the second threshold value, and Step 603 is executed when the touch pressure is higher than the second threshold value.

For example, the first threshold value is lower than the second threshold value.

Alternatively or additionally, the first threshold value and the second threshold value are system default values, or, the first threshold value and the second threshold value are values independently set by a user. For example, the first threshold value is 10, and the second threshold value is 30.

Step 602: when the touch pressure is higher than the first threshold value and lower than the second threshold value, a response instruction configured to implement a first function is generated.

Step 603: when the touch pressure is higher than the second threshold value, a response instruction configured to implement a second function is generated.

When the input circuitry is an input circuitry corresponding to different functions, the first function and the second function are different, and there exist the following conditions.

1: when the input circuitry is a task management key component, the first function is a function of displaying a task management interface, and the second function is a function of displaying a hidden menu interface of a current task.

For example, the current task of the terminal is a short message task, the user slightly touches the touch key layer of the task management key component, the pressure sensing layer acquires pressure of the touch operation, it is detected that the touch pressure is higher than the first threshold value and lower than the second threshold value, the terminal generates a response instruction configured to display the task management interface; and the user presses the touch key layer of the task management key component, the pressure sensing layer acquires pressure of the touch operation, it is detected that the touch pressure is higher than the second threshold value, and the terminal generates a response function configured to display the hidden menu interface of the short message task.

2: when the input circuitry is a home key component, the first function is a function of returning to a home interface, and the second function is a function of displaying historical interfaces.

Alternatively or additionally, the historical interfaces include display interfaces, which have been opened by the user, of other tasks, and the display interfaces of the other tasks are sequentially arranged from left to right or from right to left or from top to bottom or from bottom to top according to an opening time sequence of the user.

For example, the current task of the terminal is the short message task, the user slightly touches the touch key layer of the home key component, the pressure sensing layer acquires pressure of the touch operation, it is detected that the touch pressure is higher than the first threshold value and lower than the second threshold value, and the terminal generates a response instruction configured to return to the home interface; and the user presses the touch key layer of the home key component, the pressure sensing layer acquires pressure of the touch operation, it is detected that the touch pressure is higher than the second threshold value, and the terminal generates a response function configured to display the historical interfaces.

3: when the input circuitry is a back key component, the first function is a function of returning to a previous interface or returning to previous operation, and the second function is a function of displaying hierarchical interfaces of the current task.

Alternatively or additionally, the hierarchical interfaces of the current task are sequentially arranged from left to right or from right to left or from top to bottom or from bottom to top according to a sequence of a hierarchical relationship.

For example, the current task of the terminal is a browser, the user slightly touches the touch key layer of the back key component, the pressure sensing layer acquires pressure of the touch operation, it is detected that the touch pressure is higher than the first threshold value and lower than the second threshold value, and the terminal generates a response instruction configured to return to a previous web page; and the user presses the touch key layer of the back key component, the pressure sensing layer acquires pressure of the touch operation, it is detected that the touch pressure is higher than the second threshold value, and the terminal generates a response function configured to display web pages which have been opened in the browser according to a hierarchical relationship.

It is important to note that terms "one, two and three" are only adopted for description and not intended to indicate or imply relative importance or imply the number of indicated technical characteristics. Therefore, characteristics of limited "one, two and three" may expressly indicate or imply one or more such characteristics.

Step 604: the response instruction is executed.

The terminal executes the first function or the second function according to the generated response instruction.

Figure 7:
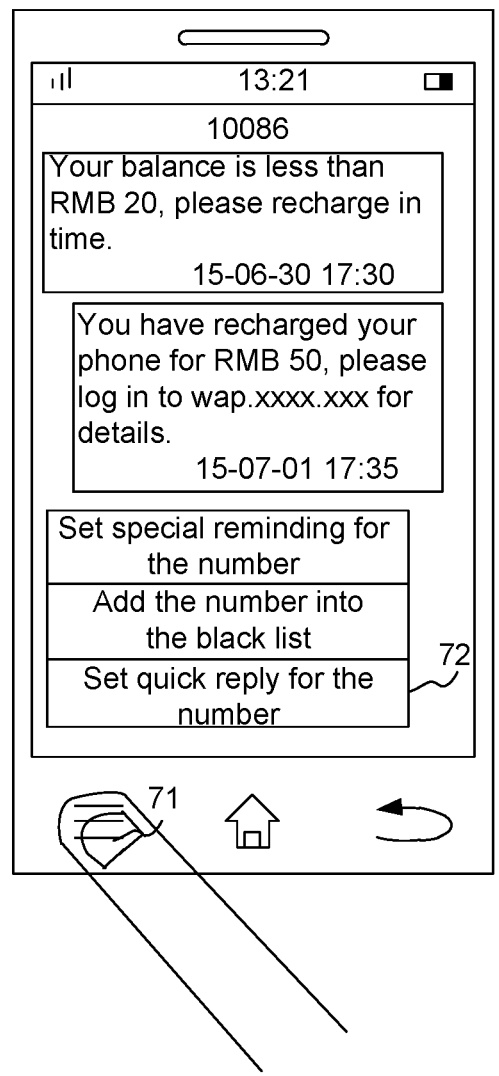
FIG. 7 is an implementation diagram of a touch response method according to one or more exemplary embodiments.

For example: the input circuitry is the task management key component, the current task of the terminal is the short message task, as shown in FIG. 7, the user presses the task management key component 71, the pressure sensing layer acquires the touch pressure, it is detected that the touch pressure is higher than the second threshold value, the response instruction configured to display the hidden menu interface of the short message task, and the terminal displays the hidden menu interface 72 of the short message task.

Figures 8, 9:
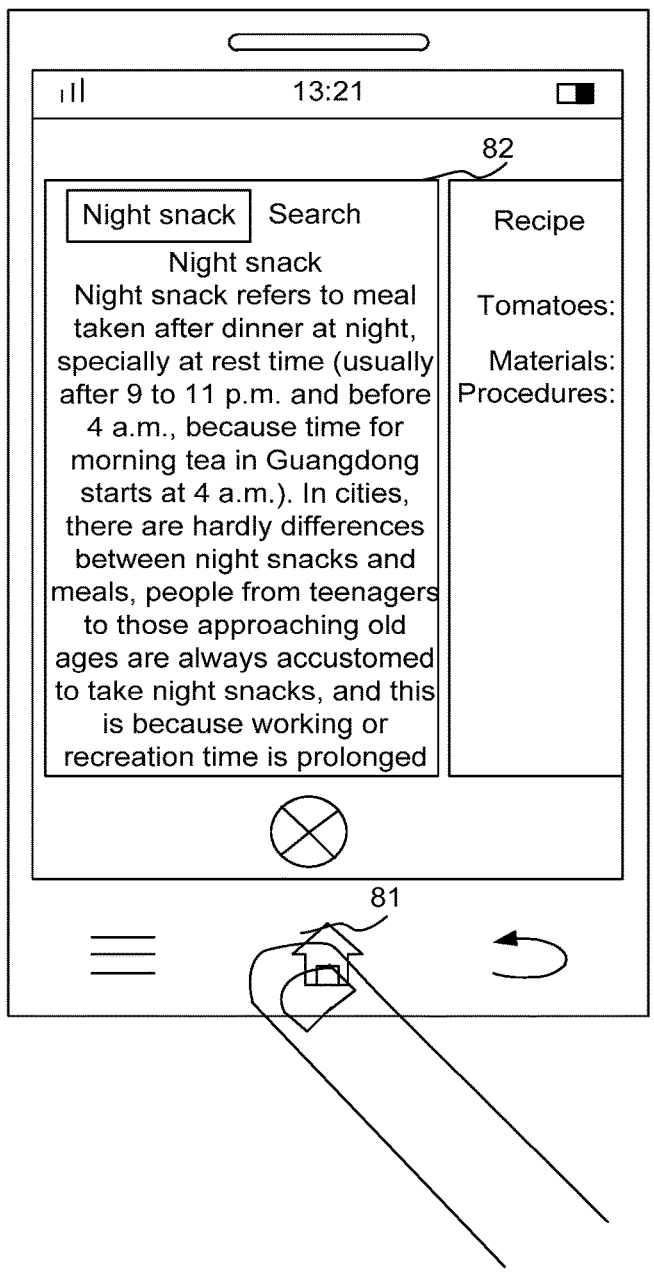
FIG. 8 is an implementation diagram of a touch response method according to one or more embodiments.
FIG. 9 is a flow chart of a touch response method according to one or more exemplary embodiments.

For example, the input circuitry is the back key component, the current task of the terminal is the browser, as shown in FIG. 8, the user presses the home back key component 81, the pressure sensing layer acquires the pressure of the touch operation, it is detected that the touch pressure is higher than the second threshold value, the terminal generates the response function configured to display the web pages which have been opened in the browser according to the hierarchical relationship, and the terminal displays the web pages 82 which have been opened in the browser according to the hierarchical relationship.

Step 605: when the pressure sensing layer acquires the touch pressure acting on the input circuitry, the vibration layer is controlled to generate vibration of which a vibration amplitude is directly proportional to the touch pressure.

The touch pressure acquired by the pressure sensing layer is higher if the touch pressure of the user on the input circuitry is higher, the vibration amplitude is higher if the touch pressure is higher, and the vibration amplitude is lower if the touch pressure is lower.

Alternatively or additionally, when the touch pressure is higher than the second threshold value, the vibration layer is controlled to generate vibration, and when the touch pressure is lower than the second threshold value, the vibration layer is not controlled to generate vibration.

Alternatively or additionally, when the user's touch operation of performed on the input circuitry is continuous touch operation, the vibration layer is controlled to generate vibration directly proportional to vibration time once; and when the user's touch operation performed on the input circuitry is short touch operation, the vibration layer is controlled to generate vibration twice.

For example, the user presses the input circuitry for long, and the input circuitry generates continuous vibration until a finger of the user leaves the input circuitry or a pressure level is reduced to make the touch pressure lower than the second threshold value; or, the user rapidly presses the input circuitry and then moves the finger, the input circuitry rapidly vibrates twice.

It is important to note that the step may be executed together with Step 604, which will not be limited by the embodiments of the present disclosure.

Step 606: when the touch key layer senses the touch operation performed on the input circuitry, the fingerprint identification layer is controlled to acquire and identify a fingerprint image.

The fingerprint identification layer acquires the fingerprint image of the finger, placed on the input circuitry, of the user, and compares the acquired fingerprint image with a fingerprint image pre-stored in the terminal.

As shown in FIG. 9, the step may be implemented by the following steps:

Step 901: it is detected whether the terminal is in a predetermined mode, the predetermined mode being at least one of a screen locking mode, a payment mode and an identity authentication mode; and Step 902: if the terminal is in the predetermined mode, the fingerprint identification layer is controlled to acquire and identify the fingerprint image.

Alternatively or additionally, when the terminal is in the predetermined mode, a capacitive detection array of the touch key layer in the input circuitry is energized, and the fingerprint identification layer is controlled to acquire the fingerprint image by virtue of a capacitance change.

Alternatively or additionally, the terminal is in the screen locking mode, the fingerprint identification layer is controlled to acquire and identify the fingerprint image, and terminal is unlocked by virtue of the fingerprint image; the terminal is in the payment mode, the fingerprint identification layer is controlled to acquire and identify the fingerprint image, and the fingerprint image is utilized for payment; and the terminal is in the identity authentication mode, the fingerprint identification layer is controlled to acquire and identify the fingerprint image, and a user identity is authenticated by virtue of the fingerprint image.

It is important to note that the Step may be executed before Step 602 or Step 603, which will not be limited in the embodiments of the present disclosure.

From the above, according to the touch response method provided by the present disclosure, when the touch key layer senses the touch operation performed on the input circuitry, the touch pressure is acquired through the pressure sensing layer, the response instruction is generated according to the touch pressure, and the terminal executes the response instruction. Since the response instruction is generated according to the touch pressure of the touch operation, the problem that user's false touch operations are responded by a terminal may be avoided, and it is possible to achieve the effects of effectively distinguishing intended operation and the false touch operation of the user and improving user experiences.

In addition, according to the touch response method provided by the present disclosure, the touch pressure is also compared with the first threshold value, and the terminal may generate the response instruction only under the condition that the touch pressure is higher than the first threshold value, so that operation triggered by false touch may be effectively avoided; and the touch operation of the user is distinguished by virtue of the first threshold value and the second threshold value, so that more convenience may be brought to the operation of the user.

In addition, according to the touch response method provided by the present disclosure, the vibration layer is also controlled to generate vibration, so that the user may sense own touch level to obtain a touch feeling feedback of a real key when executing the touch operation performed on the input circuitry.

In addition, according to the touch response method provided by the present disclosure, the fingerprint identification layer is also controlled to acquire and identify the fingerprint image under the predetermined mode, so that the fingerprint identification layer is prevented from being in an energized state all the time, and it is possible to achieve the effects of reducing power consumption of the terminal and avoiding loss of a high-precision capacitance device.

Figure 10:
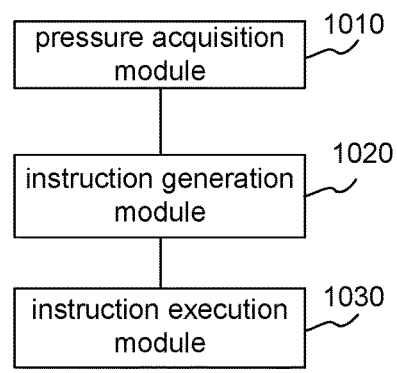
FIG. 10 is a block diagram of a touch response device according to one or more embodiments of the present disclosure.

FIG. 10 is a structure block diagram of a touch response device according to one or more embodiments of the present disclosure. The touch response device may be implemented to be all or part of the abovementioned touch response method by virtue of software, hardware or a combination of the two. As shown in FIG. 10, the device includes:

a pressure acquisition module 1010 configured to, when a touch key layer senses touch operation performed on an input circuitry, acquire touch pressure through a pressure sensing layer;

an instruction generation module 1020 configured to generate a response instruction according to the touch pressure; and an instruction execution module 1030 configured to execute the response instruction generated by the instruction generation module 1020.

From the above, according to the touch response device provided by the present disclosure, when the touch key layer senses the touch operation performed on the input circuitry, the touch pressure is acquired through the pressure sensing layer, the response instruction is generated according to the touch pressure, and the terminal executes the response instruction. Since the response instruction is generated according to the touch pressure of the touch operation, the problem that user's false touch operations are responded by a terminal may be avoided, and it is possible to achieve the effects of effectively distinguishing intended operation and the false touch operation of the user and improving user experiences.

Figure 11:
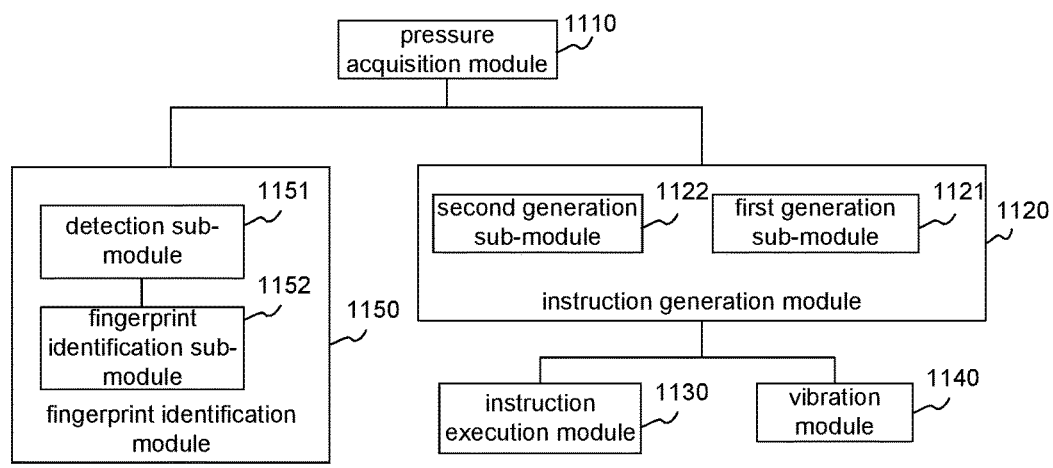
FIG. 11 is a block diagram of a touch response device according to one or more embodiments of the present disclosure.

FIG. 11 is a structure block diagram of a touch response device according to another embodiment of the present disclosure. The touch response device may be implemented to be all or part of the abovementioned touch response method by virtue of software, hardware or a combination of the two. As shown in FIG. 11, the device may include at least one of the following: a pressure acquisition module 1110, an instruction generation module 1120, and an instruction execution module 1130.

The pressure acquisition module 1110 is configured to acquire touch pressure through a pressure sensing layer when a touch key layer senses touch operation performed on an input circuitry. The instruction generation module 1120 is configured to generate a response instruction according to the touch pressure. The instruction execution module 1130 is configured to execute the response instruction generated by the instruction generation module 1120.

Alternatively or additionally, the instruction generation module 1120 includes: a first generation sub-module 1121 and a second generation sub-module 1122. The first generation sub-module 1121 is configured to generate a response instruction configured to implement a first function when the touch pressure is higher than a first threshold value and lower than a second threshold value. The second generation sub-module 1122 is configured to generate a response instruction configured to implement a second function when the touch pressure is higher than the second threshold value. Here, the first threshold value is lower than the second threshold value.

Alternatively or additionally, the input circuitry may include a task management key component. When the touch key layer senses the touch operation performed on the task management key component in the input circuitry, the first function includes a function of displaying a task management interface, and the second function includes a function of displaying a hidden menu interface of a current task.

Additionally or alternatively, the input circuitry may include a home key component. When the touch key layer senses the touch operation performed on the home key component in the input circuitry, the first function includes a function of returning to a home interface, and the second function includes a function of displaying historical interfaces.

Additionally or alternatively, the input circuitry may include a back key component. When the touch key layer senses the touch operation performed on the back key component in the input circuitry, the first function includes a function of returning to a previous interface or returning to previous operation, and the second function includes a function of displaying hierarchical interfaces of the current task.

Alternatively or additionally, when the input circuitry is an input circuitry shown in FIG. 1, the device further includes: a vibration module 1140 configured to, when the pressure sensing layer acquires the touch pressure acting on the input circuitry, control a vibration layer to generate vibration of which a vibration amplitude is directly proportional to the touch pressure.

Alternatively or additionally, when the input circuitry is the input circuitry shown in FIG. 1, the device further includes: a fingerprint identification module 1150 configured to, when the touch key layer senses the touch operation performed on the input circuitry, control a fingerprint identification layer to acquire and identify a fingerprint image.

Alternatively or additionally, the fingerprint identification module 1150 includes:

a detection sub-module 1151 configured to detect whether the terminal is in a predetermined mode, the predetermined mode being at least one of a screen locking mode, a payment mode and an identity authentication mode; and a fingerprint identification sub-module 1152 configured to, when the terminal is in the predetermined mode, control the fingerprint identification layer to acquire and identify the fingerprint image.

From the above, according to the touch response device provided by the present disclosure, when the touch key layer senses the touch operation performed on the input circuitry, the touch pressure is acquired through the pressure sensing layer, the response instruction is generated according to the touch pressure, and the terminal executes the response instruction. Since the response instruction is generated according to the touch pressure of the touch operation, the problem that user's false touch operations are responded by a terminal may be avoided, and it is possible to achieve the effects of effectively distinguishing intended operation and the false touch operation of the user and improving user experiences.

In addition, according to the touch response device provided by the present disclosure, the touch pressure is also compared with the first threshold value, and the terminal may generate the response instruction only under the condition that the touch pressure is higher than the first threshold value, so that operation triggered by false touch may be effectively avoided; and the touch operation of the user is distinguished by virtue of the first threshold value and the second threshold value, so that more convenience may be brought to the operation of the user.

In addition, according to the touch response device provided by the present disclosure, the vibration layer is also controlled to generate vibration, so that the user may sense own touch level to obtain a touch feeling feedback of a real key when executing the touch operation performed on the input circuitry.

In addition, according to the touch response device provided by the present disclosure, the fingerprint identification layer is also controlled to acquire and identify the fingerprint image under the predetermined mode, so that the fingerprint identification layer is prevented from being in an energized state all the time, and t it is possible to achieve the effects of reducing power consumption of the terminal and avoiding loss of a high-precision capacitance device.

With respect to the devices in the above embodiments, the specific manners for performing operations for individual modules therein have been described in detail in the embodiments regarding the methods, which will not be elaborated herein.

The present disclosure further provides a touch response device, which includes: an input circuitry comprising a touch key layer and a pressure sensing layer, a processor electronically connected to the input circuitry, and a memory configured to store an instruction executable for the processor. The processor is configured to acquire touch pressure through a pressure sensing layer when a touch key layer senses touch operation performed on the input circuitry. The processor is further configured to generate a response instruction according to the touch pressure and execute the response instruction.

Figure 12:
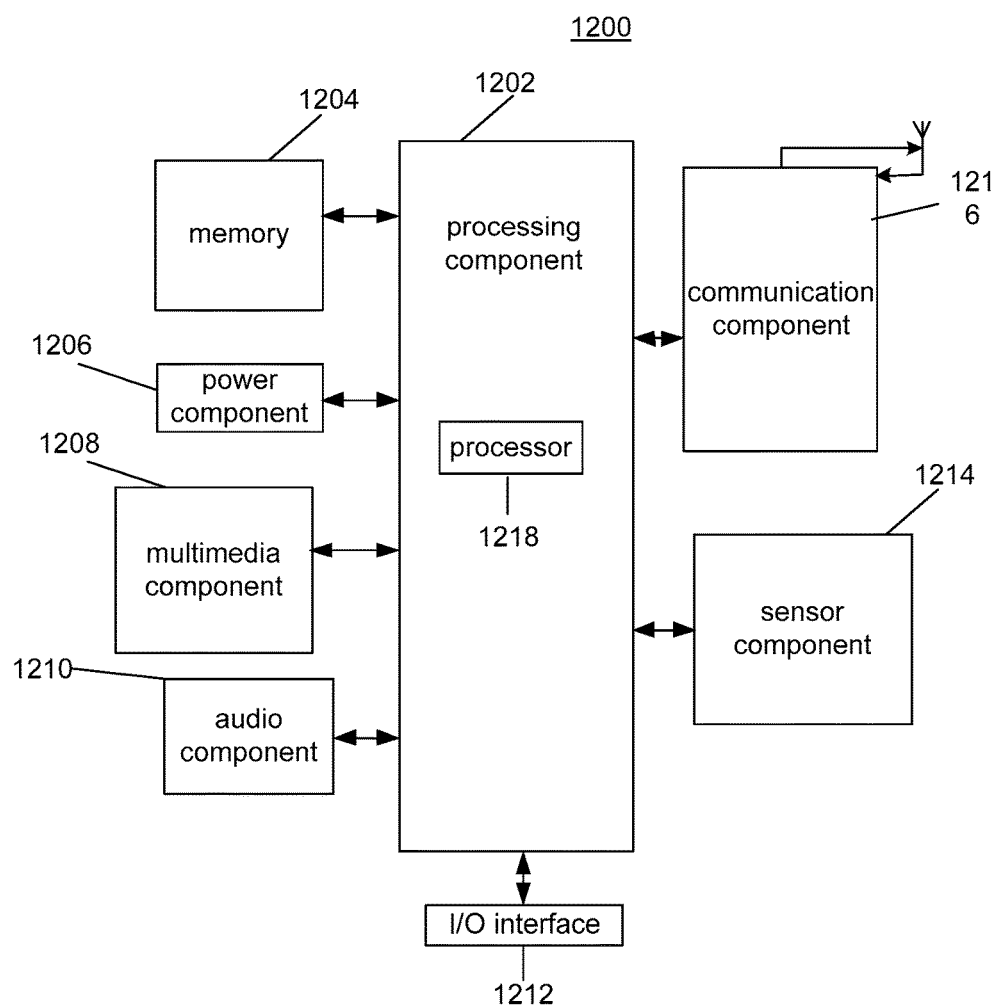
FIG. 12 is a block diagram of a touch response device according to one or more embodiments of the present disclosure.

FIG. 12 is a block diagram of a touch response device according to an exemplary embodiment. For example, the device 1200 may be a mobile phone, a computer, a digital broadcast terminal, a messaging device, a gaming console, a tablet, a medical device, exercise equipment, a Personal Digital Assistant (PDA) and the like.

Referring to FIG. 12, the device 1200 may include one or more of the following components: a processing component 1202, a memory 1204, a power component 1206, a multimedia component 1208, an audio component 1210, an Input/Output (I/O) interface 1212, a sensor component 1214, and a communication component 1216.

The processing component 1202 typically controls overall operations of the device 1200, such as the operations associated with display, telephone calls, data communications, camera operations, and recording operations. The processing component 1202 may include one or more processors 1218 to execute instructions to perform all or part of the steps in the abovementioned method. Moreover, the processing component 1202 may include one or more modules which facilitate interaction between the processing component 1202 and the other components. For instance, the processing component 1202 may include a multimedia module to facilitate interaction between the multimedia component 1208 and the processing component 1202.

The memory 1204 is configured to store various types of data to support the operation of the device 1200. Examples of such data include instructions for any application programs or methods operated on the device 1200, contact data, phonebook data, messages, pictures, video, etc. The memory 1204 may be implemented by any type of volatile or non-volatile memory devices, or a combination thereof, such as a Static Random Access Memory (SRAM), an Electrically Erasable Programmable Read-Only Memory (EEPROM), an Erasable Programmable Read-Only Memory (EPROM), a Programmable Read-Only Memory (PROM), a Read-Only Memory (ROM), a magnetic memory, a flash memory, and a magnetic or optical disk.

The power component 1206 provides power for various components of the device 1200. The power component 1206 may include a power management system, one or more power supplies, and other components associated with the generation, management and distribution of power for the device 1200.

The multimedia component 1208 includes a screen providing an output interface between the device 1200 and a user. In some embodiments, the screen may include a Liquid Crystal Display (LCD) and a Touch Panel (TP). If the screen includes the TP, the screen may be implemented as a touch screen to receive an input signal from the user. The TP includes one or more touch sensors to sense touches, swipes and gestures on the TP. The touch sensors may not only sense a boundary of a touch or swipe action, but also sense a duration and pressure associated with the touch or swipe action. In some embodiments, the multimedia component 1208 includes a front camera and/or a rear camera. The front camera and/or the rear camera may receive external multimedia data when the device 1200 is in an operation mode, such as a photographing mode or a video mode. Each of the front camera and the rear camera may be a fixed optical lens system or have focusing and optical zooming capabilities.

The audio component 1210 is configured to output and/or input an audio signal. For example, the audio component 1210 includes a Microphone (MIC), and the MIC is configured to receive an external audio signal when the device 1200 is in the operation mode, such as a call mode, a recording mode and a voice recognition mode. The received audio signal may be further stored in the memory 1204 or sent through the communication component 1216. In some embodiments, the audio component 1210 further includes a speaker configured to output the audio signal.

The I/O interface 1212 provides an interface between the processing component 1202 and a peripheral interface module, and the peripheral interface module may be a keyboard, a click wheel, a button and the like. The button may include, but not limited to: a home button, a volume button, a starting button and a locking button.

The sensor component 1214 includes one or more sensors configured to provide status assessment in various aspects for the device 1200. For instance, the sensor component 1214 may detect an on/off status of the device 1200 and relative positioning of components, such as a display and small keyboard of the device 1200, and the sensor component 1214 may further detect a change in a position of the device 1200 or a component of the device 1200, presence or absence of contact between the user and the device 1200, orientation or acceleration/deceleration of the device 1200 and a change in temperature of the device 1200. The sensor component 1214 may include a proximity sensor configured to detect presence of an object nearby without any physical contact. The sensor component 1214 may also include a light sensor, such as a Complementary Metal Oxide Semiconductor (CMOS) or Charge Coupled Device (CCD) image sensor configured for use in an imaging application. In some embodiments, the sensor component 1214 may also include an acceleration sensor, a gyroscope sensor, a magnetic sensor, a pressure sensor or a temperature sensor.

The communication component 1216 is configured to facilitate wired or wireless communication between the device 1200 and another device. The device 1200 may access a communication-standard-based wireless network, such as a Wireless Fidelity (WiFi) network, a 2nd-Generation (2G) or 3rd-Generation (3G) network or a combination thereof. In an exemplary embodiment, the communication component 1216 receives a broadcast signal or broadcast associated information from an external broadcast management system through a broadcast channel. In an exemplary embodiment, the communication component 1216 further includes a Near Field Communication (NFC) module to facilitate short-range communication. For example, the NFC module may be implemented on the basis of a Radio Frequency Identification (RFID) technology, an Infrared Data Association (IrDA) technology, an Ultra-WideBand (UWB) technology, a BlueTooth (BT) technology and another technology.

In an exemplary embodiment, the device 1200 may be implemented by one or more circuitries, which include Application Specific Integrated Circuits (ASICs), Digital Signal Processors (DSPs), Digital Signal Processing Devices (DSPDs), Programmable Logic Devices (PLDs), Field Programmable Gate Arrays (FPGAs), controllers, micro-controllers, microprocessors or other electronic components. The apparatus may use the circuitries in combination with the other hardware or software components for performing the above described methods. Each module, sub-module, unit, or sub-unit in the disclosure may be implemented at least partially using the one or more circuitries.

In an exemplary embodiment, there is also provided a non-transitory computer-readable storage medium including an instruction, such as the memory 1204 including an instruction, and the instruction may be executed by the processor 1218 of the device 1200 to implement the abovementioned unlocking method. For example, the non-transitory computer-readable storage medium may be a ROM, a Radom Access Memory (RAM), a Compact Disc Read-Only Memory (CD-ROM), a magnetic tape, a floppy disc, an optical data storage device and the like. Further, each module or sub-module may include non-transitory memory (shared, dedicated, or group) that stores code or instructions that can be executed by one or more processors. The module or sub-module may take the form of a packaged functional hardware unit designed for use with other components, a portion of a program code (e.g., software or firmware) executable by the processor 1218, one or more circuitries that usually perform a particular function of related functions, or a self-contained hardware or software component that interfaces with a larger system, for example.

Other embodiments of the present disclosure will be apparent to those skilled in the art from consideration of the specification and practice of the present disclosure. This application is intended to cover any variations, uses, or adaptations of the present disclosure following the general principles thereof and including such departures from the present disclosure as come within known or customary practice in the art. It is intended that the specification and examples be considered as exemplary only, with a true scope and spirit of the present disclosure being indicated by the following claims.

According to the technical solutions of the disclosure, when the touch key layer senses the touch operation performed on the input circuitry, the touch pressure is acquired through the pressure sensing layer, the response instruction is generated according to the touch pressure, and the terminal executes the response instruction. Since the response instruction is generated according to the touch pressure of the touch operation, the problem that user's false touch operations are responded by a terminal may be avoided, and it is possible to achieve the effects of effectively distinguishing intended operation and the false touch operation of the user and improving user experiences.

It will be appreciated that the present disclosure is not limited to the exact examples that has been described above and illustrated in the accompanying drawings, and that various modifications and changes may be made without departing from the scope thereof. It is intended that the scope of the present disclosure only be limited by the appended claims.

What is claimed is:

1. An input circuitry, comprising:
    a touch key layer, a fingerprint identification layer and a pressure sensing layer, wherein the touch key layer having elasticity is positioned above the pressure sensing layer, and the fingerprint identification layer is positioned between the touch key layer and the pressure sensing layer, and configured to acquire and identify a fingerprint image;
    wherein the touch key layer is physically separated from a touch screen and configured to receive a touch operation, wherein both the touch screen and the input circuitry are in one terminal; and
    wherein the pressure sensing layer is configured to acquire a touch pressure of the touch operation performed on the touch key layer based on a shape deformation of the touch key layer.

2. The input circuitry according to claim 1, further comprising:
    a vibration layer positioned below the pressure sensing layer.

3. The input circuitry according to claim 2, wherein the vibration layer is configured to, when the pressure sensing layer acquires the touch pressure, generate vibration with a vibration amplitude that is directly proportional to the touch pressure.

4. The input circuitry according to claim 1, wherein the touch key layer comprises a capacitive touch key layer.

5. A method, comprising:
    determining, by a terminal including a touch screen and an input circuitry, wherein the input circuitry comprises a touch key layer physically separated from the touch screen, a fingerprint identification layer and a pressure sensing layer, whether there is a touch operation performed on the input circuitry, wherein the touch key layer having elasticity is positioned above the pressure sensing layer, and the fingerprint identification layer is positioned between the touch key layer and the pressure sensing layer, and configured to acquire and identify a fingerprint image;
    when the touch key layer senses the touch operation performed on the input circuitry, acquiring a touch pressure through the pressure sensing layer based on a shape deformation of the touch key layer;
    generating, by the terminal, a response instruction according to the touch pressure; and
    executing, by the terminal, the response instruction.

6. The method according to claim 5, wherein generating the response instruction according to the touch pressure comprises:
    when the touch pressure is higher than a first threshold value and lower than a second threshold value, generating a first response instruction configured to implement a first function; and
    when the touch pressure is higher than the second threshold value, generating a second response instruction configured to implement a second function,
    wherein the first threshold value is lower than the second threshold value.

7. The method according to claim 6, further comprising:
    when the touch key layer senses the touch operation performed on a task management key component in the input circuitry, the first function comprises displaying a task management interface, and the second function comprises displaying a hidden menu interface of a current task.

8. The method according to claim 7, further comprising:
    when the touch key layer senses the touch operation performed on a home key component in the input circuitry, the first function comprises returning to a home interface, and the second function comprises displaying historical interfaces.

9. The method according to claim 8, further comprising:
    when the touch key layer senses the touch operation performed on a back key component in the input circuitry, the first function comprises returning to a previous interface or returning to previous operation, and the second function comprises displaying hierarchical interfaces of the current task.

10. The method according to claim 6, further comprising:
    when the pressure sensing layer acquires the touch pressure acting on the input circuitry, controlling a vibration layer to generate a vibration with a vibration amplitude that is directly proportional to the touch pressure, wherein the vibration layer is positioned below the pressure sensing layer of the input circuitry.

11. The method according to claim 6, further comprising:
    when the touch key layer senses the touch operation performed on the input circuitry, controlling a fingerprint identification layer to acquire and identify a fingerprint image, wherein the fingerprint identification layer is positioned between the touch key layer and the pressure sensing layer.

12. The method according to claim 11, wherein controlling the fingerprint identification layer to acquire and identify the fingerprint image comprises:
    detecting whether the terminal is in a predetermined mode, the predetermined mode comprises at least one of a screen locking mode, a payment mode, and an identity authentication mode; and
    when the terminal is in the predetermined mode, controlling the fingerprint identification layer to acquire and identify the fingerprint image.

13. A device, comprising:
    an input circuitry comprising a touch key layer, a fingerprint identification layer and a pressure sensing layer, wherein the touch key layer having elasticity is positioned above the pressure sensing layer, and the fingerprint identification layer is positioned between the touch key layer and the pressure sensing layer, and configured to acquire and identify a fingerprint image;

a processor electronically connected to the input circuitry and in communication with a touch screen; and a memory configured to store instructions executable by the processor, wherein the processor is configured to:

when the touch key layer senses a touch operation performed on the input circuitry, acquire touch pressure through the pressure sensing layer based on a shape deformation of the touch key layer;

generate a response instruction according to the touch pressure; and execute the response instruction, wherein the touch screen is located on the first side of the device and is physically separated from the input circuitry.

14. The device according to claim 13, wherein the processor is configured to:

when the touch pressure is higher than a first threshold value and lower than a second threshold value, generate a response instruction configured to implement a first function; and when the touch pressure is higher than the second threshold value, generate a response instruction configured to implement a second function, wherein the first threshold value is lower than the second threshold value.

15. The device according to claim 14, wherein the input circuitry comprises a task management key component, when the touch key layer senses the touch operation performed on the task management key component, the first function comprises displaying a task management interface, and the second function comprises displaying a hidden menu interface of a current task.

16. The device according to claim 15, wherein the input circuitry comprises a home key component, when the touch key layer senses the touch operation performed on the home key component, the first function comprises a function of returning to a home interface, and the second function comprises displaying historical interfaces; and wherein the input circuitry comprises a back key component, when the touch key layer senses the touch operation performed on the back key component, the first function comprises returning to a previous interface or returning to previous operation, and the second function comprises displaying hierarchical interfaces of the current task.

17. The device according to claim 13, wherein when the input circuitry further comprises a vibration layer positioned below the pressure sensing layer, and the vibration layer is configured to, when the pressure sensing layer acquires the touch pressure, generate vibration of which a vibration amplitude is directly proportional to the touch pressure, the processor is further configured to:

when the pressure sensing layer acquires the touch pressure acting on the input circuitry, control the vibration layer to generate vibration of which a vibration amplitude is directly proportional to the touch pressure.

18. The device according to claim 13, wherein when the input circuitry further comprises a fingerprint identification layer, wherein the fingerprint identification layer is positioned between the touch key layer and the pressure sensing layer, and the fingerprint identification layer is configured to acquire and identify a fingerprint image, the processor is further configured to:

when the touch key layer senses the touch operation performed on the input circuitry, control the fingerprint identification layer to acquire and identify a fingerprint image.

19. The device according to claim 18, wherein the processor is further configured to:

detect whether the device is in a predetermined mode, the predetermined mode comprises at least one of a screen locking mode, a payment mode, and an identity authentication mode; and when the device is in the predetermined mode, control the fingerprint identification layer to acquire and identify the fingerprint image.

* * * * *